United States Patent
Jeon et al.

(10) Patent No.: US 9,692,461 B2
(45) Date of Patent: Jun. 27, 2017

(54) AMPLIFIER MODULE

(71) Applicant: Avago Technologies General IP (Singapore) Pte. Ltd., Singapore (SG)

(72) Inventors: Joo Young Jeon, Gyeonggi-do (KR); Donghyeon Ji, Gyeonggi-do (KR); Jung Hyun Kim, Gyeonggi-do (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/374,011

(22) Filed: Dec. 9, 2016

(65) Prior Publication Data

US 2017/0093443 A1    Mar. 30, 2017

Related U.S. Application Data

(62) Division of application No. 14/644,296, filed on Mar. 11, 2015, now Pat. No. 9,559,731.

(51) Int. Cl.
*H04B 17/00* (2015.01)
*H04B 1/04* (2006.01)
*G01R 25/04* (2006.01)

(52) U.S. Cl.
CPC ............ *H04B 1/04* (2013.01); *G01R 25/04* (2013.01); *H04B 2001/0408* (2013.01)

(58) Field of Classification Search
CPC .. H04B 1/04; H04B 2001/0408; G01R 25/00; G01R 25/04
See application file for complete search history.

(56) References Cited

U.S. PATENT DOCUMENTS

| | | | |
|---|---|---|---|
| 6,636,570 B1* | 10/2003 | Choi | H04L 27/2275 329/304 |
| 2007/0029955 A1* | 2/2007 | Kanekawa | G01D 5/2073 318/144 |

* cited by examiner

*Primary Examiner* — Nguyen Vo

(57) ABSTRACT

An amplifier module includes a magnitude detector configured to detect a magnitude of a reflection coefficient, and a phase detector configured to detect a phase of the reflection coefficient The magnitude detector includes an incident signal amplifier configured to amplify an incident signal, an output level controller configured control a level of an output of the incident signal amplifier, a reflected signal amplifier configured to amplify a reflected signal, and a comparator configured to compare an output of the incident signal amplifier with an output of the reflected signal amplifier to output a comparison result indicating whether the magnitude of the reflection coefficient is equal to or greater than a threshold determined based on the control signal.

17 Claims, 11 Drawing Sheets

AMPLIFIER MODULE

CROSS-REFERENCE TO RELATED APPLICATIONS

The present application is a divisional application of U.S. patent application Ser. No. 14/644,296, filed on Mar. 11, 2015. Priority is claimed under 35 U.S.C. §120 to U.S. patent application Ser. No. 14/644,296, and the entire disclosure of U.S. patent application Ser. No. 14/644,296 is specifically incorporated herein by reference.

BACKGROUND

An impedance of an antenna in a radio frequency (RF) signal transmitter is influenced by variances in the environment surrounding the antenna such as an approach of an automobile or physical contact by a user. Variation in the impedance may cause a mismatch between the impedance of the antenna and that of a power amplifier supplying a signal to the antenna, and may adversely affect the performance of wireless communications. In particular, such mismatch may generate a reflected signal flowing from the antenna to the power amplifier, causing interference among signals within the signal transmitter, and a reduction in performance or efficiency of the signal transmitter.

What is needed, therefore, is an apparatus that overcomes at least the shortcomings of the known signal transmitter discussed above.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

Although the terms "first", "second", etc. may be used herein to describe various elements, these elements should not be limited by these terms. These terms are used to distinguish one element from another. For example, a first element could be termed a second element, and, similarly, a second element could be termed a first element, without departing from the scope of the present teachings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
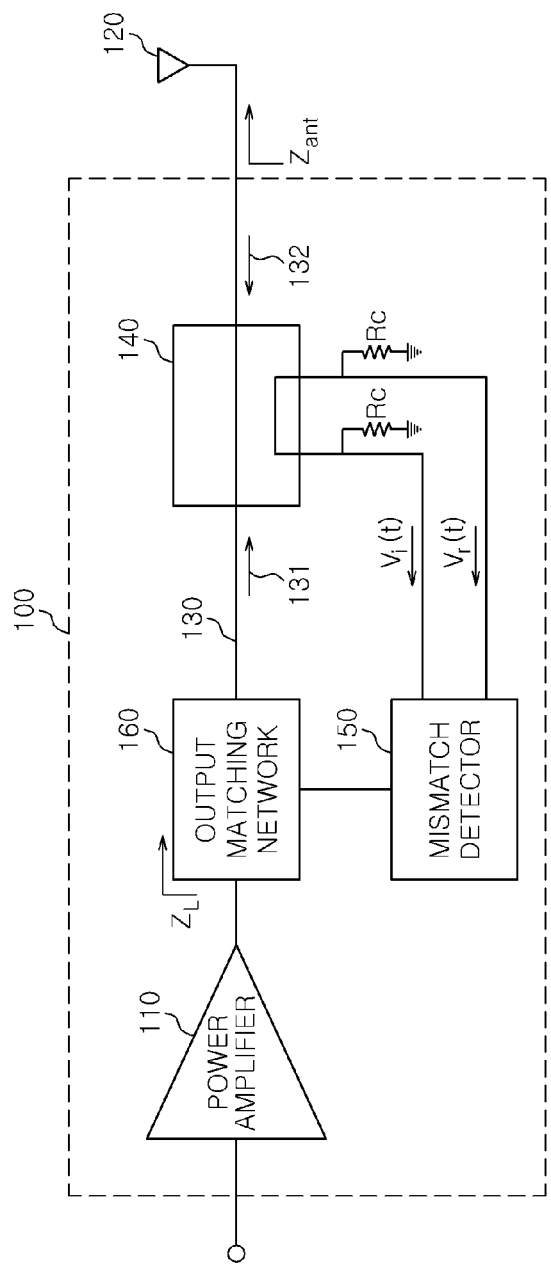
FIG. 1 illustrates an amplifier module in accordance with a representative embodiment.

FIG. 1 illustrates an amplifier module 100 in accordance with a representative embodiment Referring to FIG. 1, the amplifier module 100 includes a power amplifier 110, a transmission line 130, a directional coupler 140, a mismatch detector 150, and an output matching network 160. The amplifier module 100 may be formed in an integrated circuit. The amplifier module 100 may be used in a radio frequency (RF) device such as an RF signal transmitter.

The power amplifier 110 supplies a transmission signal 131 to an antenna 120 i.e., a load, via the transmission line 130. Due to a mismatch between an impedance of the power amplifier 110 and an impedance ($Z_{ant}$) of the antenna 120, a signal 132 reflected from the antenna 120 and flowing to the power amplifier 110 may be generated. The directional coupler 140 outputs an incident signal ($V_i(t)$) by sampling the transmission signal 131 and outputs a reflected signal ($V_r(t)$) by sampling the signal 132. A reflection coefficient ($\Gamma_L$) is a ratio of the reflected signal ($V_r(t)$) to the incident signal ($V_i(t)$). By using the incident signal ($V_i(t)$) and the reflected signal ($V_r(t)$), the mismatch detector 150 may compare a magnitude ($|\Gamma_L|$) of the reflection coefficient with a threshold and may detect a phase range to which a phase ($\angle\Gamma_L$) of the reflection coefficient belongs. Based on a detection results of the mismatch detector 150, the output matching network 160 may adjust a load impedance ($Z_L$) of the power amplifier 110. That is, the mismatch detector 150 may generate a matching control signal to control the output matching network 160.

Figure 2:
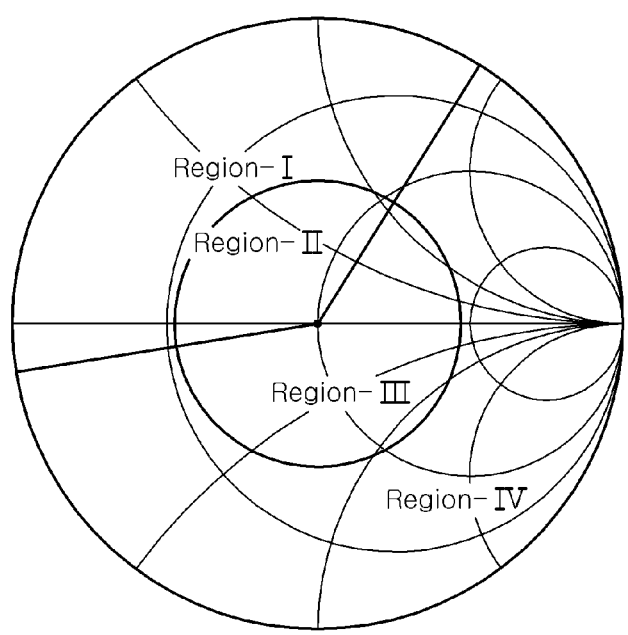
FIG. 2 is an example of division of an impedance region for mismatch detection in accordance with a representative embodiment.

FIG. 2 is an example of division of an impedance region for mismatch detection in accordance with a representative embodiment.

The impedance region may be divided into multiple regions on a Smith chart. Referring to FIG. 2, the impedance region may be divided into regions I to IV based on whether the magnitude ($|\Gamma_L|$) of a reflection coefficient is equal to or greater than a specific value and whether a phase ($\angle\Gamma_L$) of the reflection coefficient belongs to a specific range. For example, region I may indicate that the magnitude ($|\Gamma_L|$) of the reflection coefficient is equal to or greater than the specific value and that the phase ($\angle\Gamma_L$) of the reflection coefficient belongs to the specific region. If it is detected that the impedance ($Z_{ant}$) of the antenna 120 belongs to region I, the output matching network 160 may adjust the load impedance ($Z_L$) of the power amplifier 110.

In accordance with a representative embodiment, the mismatch detector 150 may include a reflection coefficient magnitude detector 300 and one of reflection coefficient phase detectors 400 to 600.

Figure 3A:
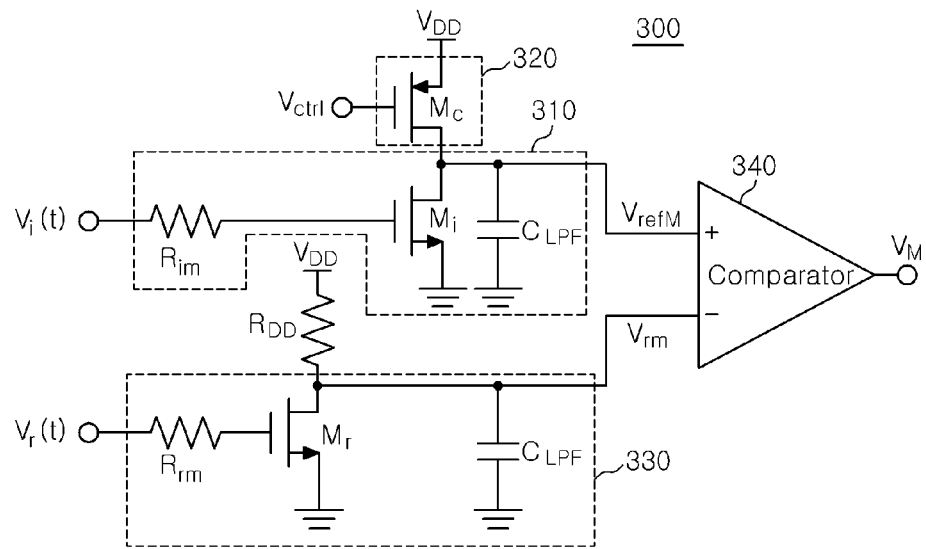
FIG. 3A shows a reflection coefficient magnitude detector in accordance with a representative embodiment.

FIG. 3A shows a reflection coefficient magnitude detector 300 in accordance with a representative embodiment.

Referring to FIG. 3A, the reflection coefficient magnitude detector 300 includes an incident signal amplifier 310, an output level controller 320, a reflected signal amplifier 330, a comparator 340, and a resistor ($R_{DD}$).

The incident signal amplifier 310 may include a common source transistor ($M_i$) and a capacitor ($C_{LPF}$) connected to the common source transistor in parallel. The incident signal amplifier 310 may further include a resistor ($R_{im}$) connected to a gate of the transistor ($M_i$). The gate of the transistor ($M_i$) receives an incident signal ($V_i(t)$) through the resistor ($R_{im}$). The incident signal amplifier 310 outputs a magnitude reference voltage ($V_{refM}$) by amplifying and rectifying the incident signal ($V_i(t)$).

The output level controller 320 may include a common drain transistor ($M_c$), which is connected in cascode between the common source transistor ($M_i$) and a supply voltage ($V_{DD}$) and receives a control signal ($V_{ctrl}$) through a gate of the common drain transistor ($M_c$). Based on the control signal ($V_{ctrl}$), a level of the magnitude reference voltage ($V_{refM}$), which is an output of the incident signal amplifier 310, is determined.

The reflected signal amplifier 330 may include a resistor ($R_{rm}$), a transistor ($M_r$), and a capacitor ($C_{LPF}$). The resistor ($R_{DD}$) may be connected between the transistor ($M_r$) of the reflected signal amplifier 330 and the supply voltage ($V_{DD}$). The reflected signal amplifier 330 receives a reflected signal ($V_r(t)$), and outputs a magnitude comparison voltage ($V_{rm}$) by amplifying and rectifying the received reflected signal ($V_r(t)$).

The comparator 340 outputs a comparison result ($V_M$) by comparing the magnitude reference voltage ($V_{refM}$) with the magnitude comparison voltage ($V_{rm}$). A non-inverting terminal and an inverting terminal of the comparator 340 may receive the magnitude reference voltage ($V_{refM}$) and magnitude comparison voltage ($V_{rm}$), respectively.

Figure 3B:
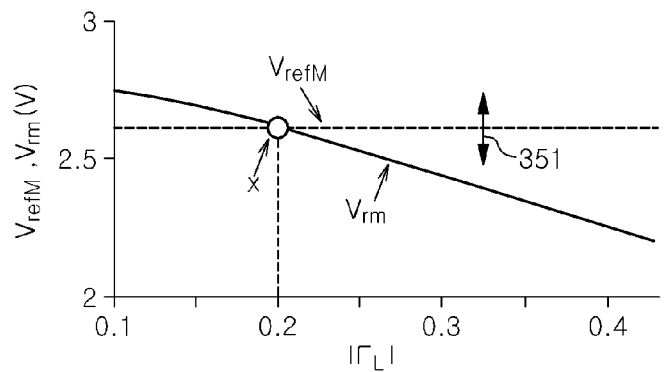
FIG. 3B is an exemplary graph showing magnitude reference voltages and magnitude comparison voltages of the reflection coefficient magnitude detector of FIG. 3A against magnitudes of a reflection coefficient.
Figure 3C:
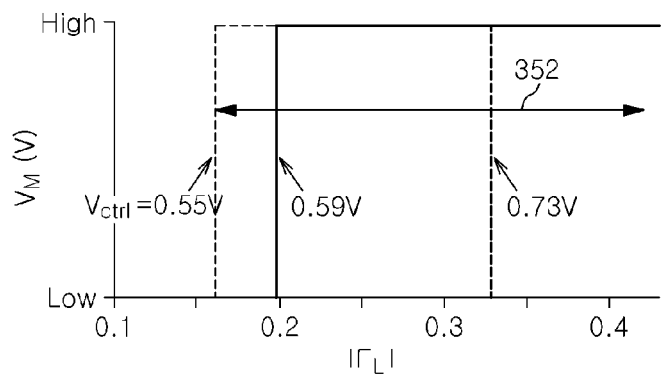
FIG. 3C is an exemplary graph showing outputs of a comparator of the reflection coefficient magnitude detector of FIG. 3A against magnitudes of a reflection coefficient.

FIG. 3B is an exemplary graph showing magnitude reference voltages ($V_{refM}$) and magnitude comparison voltages ($V_{rm}$) of the reflection coefficient magnitude detector 300 of FIG. 3A against magnitudes of a reflection coefficient. FIG. 3C is an exemplary graph showing outputs of a comparator of the reflection coefficient magnitude detector 300 of FIG. 3A against magnitudes of a reflection coefficient Referring to FIGS. 3A to 3C, the magnitude reference voltage ($V_{refM}$) has a constant value irrespective of the magnitude ($|\Gamma_L|$) of the reflection coefficient, and a magnitude comparison voltage ($V_{rm}$) decreases as the magnitude ($|\Gamma_L|$) of the reflection coefficient increases. When the magnitude reference voltage ($V_{refM}$) is equal to or greater than the magnitude comparison voltage ($V_{rm}$), the comparator 340 may output "High" (for example, $V_{DD}$), whereas when the magnitude reference voltage ($V_{refM}$) is less than the magnitude comparison voltage ($V_{rm}$), the comparator 340 may output "Low" (for example, 0).

The magnitude ($|\Gamma_L|$) of the reflection coefficient at a point (X), in which the magnitude reference voltage ($V_{refM}$) is the same as the magnitude comparison voltage ($V_{rm}$) is a threshold ($|\Gamma_{TH}|$). In other words, when the magnitude ($|\Gamma_L|$) of the reflection coefficient is greater than the threshold, the magnitude reference voltage ($V_{refM}$) is greater than the magnitude comparison voltage ($V_{rm}$), whereas when the magnitude ($|\Gamma_L|$) of the reflection coefficient is less than the threshold, the magnitude reference voltage ($V_{refM}$) is less than the magnitude comparison voltage ($V_{rm}$). Consequently, based on the comparison result ($V_M$), i.e., the output of the comparator 340, it is possible to compare the magnitude ($|\Gamma_L|$) of the reflection coefficient with the threshold ($|\Gamma_{TH}|$). Specifically, when the magnitude reference voltage ($V_{refM}$) is equal to or greater than the magnitude comparison voltage ($V_{rm}$), the comparison result ($V_M$) of the comparator 340 becomes "High", and it indicates that the magnitude ($|\Gamma_L|$) of the reflection coefficient is equal to or greater than the threshold ($|\Gamma_{TH}|$). Also, when the magnitude reference voltage ($V_{refM}$) is less than the magnitude comparison voltage ($V_{rm}$), the comparison result ($V_M$) of the comparator 340 becomes "Low", and it indicates that the magnitude ($|\Gamma_L|$) of the reflection coefficient is less than the threshold ($|\Gamma_{TH}|$).

On the other hand, the level of the magnitude reference voltage ($V_{refM}$) may be controlled by adjusting the control signal ($V_{ctrl}$). In other words, in FIG. 3B, a line indicating the magnitude reference voltage (V) may be shifted in a longitudinal (an up and down) direction 351, and in FIG. 3C, a region in which the comparison result ($V_M$) is "High" may be shifted in a lateral direction 352. Accordingly, a position of the point (X) in which the magnitude reference voltage ($V_{refM}$) is the same as the magnitude comparison voltage ($V_{rm}$) may be adjusted. In other words, the threshold ($|\Gamma_{TH}|$) may be adjusted by adjusting the control signal ($V_{ctrl}$)

Consequently, as the reflection coefficient magnitude detector 300 according to a representative embodiment may compare the magnitude ($|\Gamma_L|$) of a reflection coefficient with the variable threshold ($|\Gamma_{TH}|$), the reflection coefficient magnitude detector 300 may be precisely applied in various environments.

Figure 4A:
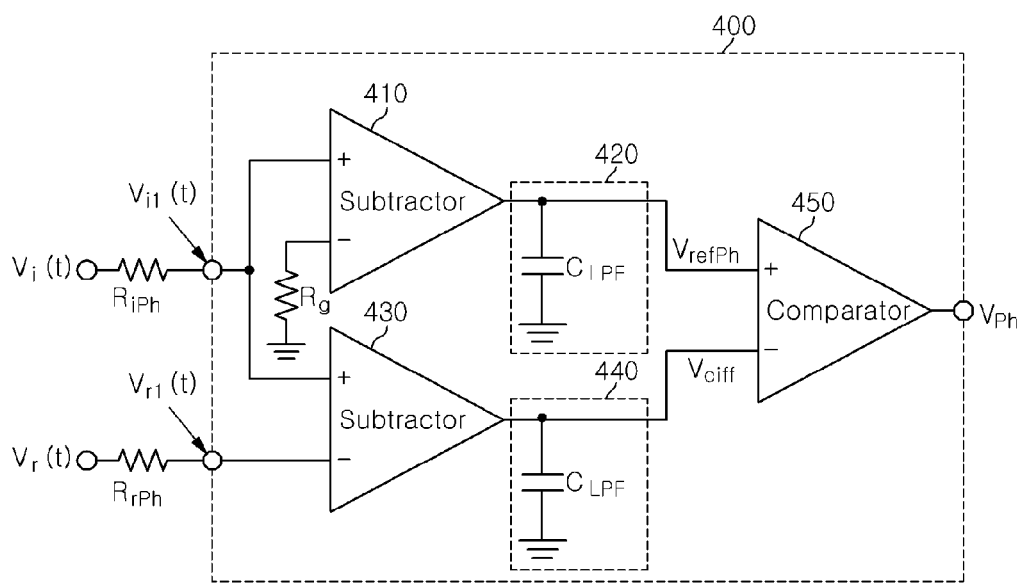
FIG. 4A shows a reflection coefficient phase detector in accordance with a representative embodiment.

FIG. 4A shows a reflection coefficient phase detector 400 in accordance with a representative embodiment.

Referring to FIG. 4A, the reflection coefficient phase detector 400 includes a subtractor 410, a low pass filter 420, a subtractor 430, a low pass filter 440, and a comparator 450.

The subtractor 410 includes a non-inverting terminal for receiving an incident signal ($V_i(t)$) through a resistor ($R_{iPh}$), and an inverting terminal connected to a ground node through a resistor ($R_g$).

The low pass filter 420 is connected to an output terminal of the subtractor 410 and outputs a phase reference voltage ($V_{refPh}$).

The subtractor 430 includes a non-inverting terminal for receiving the incident signal ($V_i(t)$) through the resistor ($R_{iPh}$), and an inverting terminal for receiving a reflected signal ($V_r(t)$) through a resistor ($R_{rPh}$).

The low pass filter 440 is connected to an output terminal of the subtractor 430 and outputs a phase comparison voltage ($V_{diff}$).

The comparator 450 outputs a comparison result ($V_{Ph}$) by comparing the phase reference voltage ($V_{refPh}$) with the phase comparison voltage ($V_{diff}$).

Figure 4B:
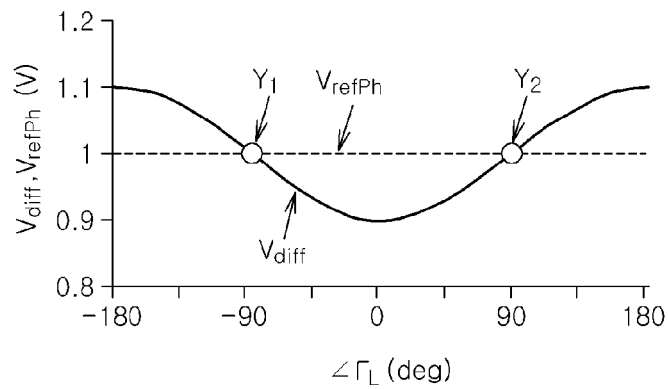
FIG. 4B is an exemplary graph showing phase reference voltages and phase comparison voltages of the reflection coefficient phase detector of FIG. 4A against phases of a reflection coefficient.
Figure 4C:
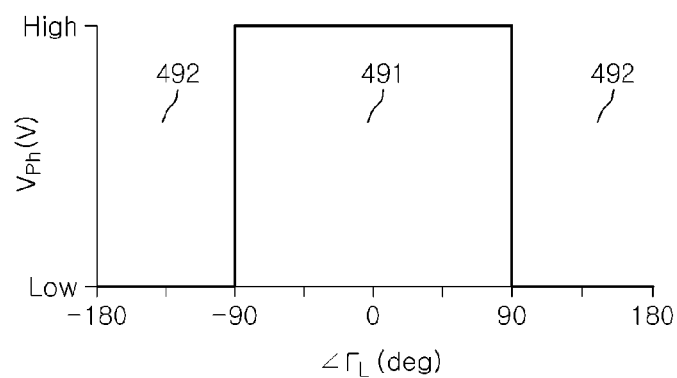
FIG. 4C is an exemplary graph showing comparison results of a comparator of the reflection coefficient phase detector of FIG. 4A against phases of a reflection coefficient.

FIG. 4B is an exemplary graph showing phase reference voltages ($V_{refPh}$) and phase comparison voltages ($V_{diff}$) of the reflection coefficient phase detector 400 of FIG. 4A against phases of a reflection coefficient. FIG. 4C is an exemplary graph showing comparison results ($V_{Ph}$) of a comparator 450 of the reflection coefficient phase detector 400 of FIG. 4A against phases of a reflection coefficient Referring to FIGS. 4A to 4C, the phase reference voltage ($V_{refPh}$) has a constant value irrespective of a phase ($\angle\Gamma_L$) of a reflection coefficient, whereas the phase comparison voltage ($V_{diff}$) varies as the phase ($\angle\Gamma_L$) of the reflection coefficient varies. The phase reference voltage ($V_{refPh}$) and the phase comparison voltage ($V_{diff}$) have two intersection points ($Y_1$, $Y_2$). In a region 491 ($-90°\sim+90°$) from the intersection point ($Y_1$) to the intersection point ($Y_2$), as the phase reference voltage ($V_{refPh}$) is equal to or greater than the phase comparison voltage ($V_{diff}$), the comparison result ($V_{Ph}$) becomes "High". On the contrary, in the remainder region 492 ($-180°\sim-90°$ and $+90°\sim180°$), as the phase reference voltage ($V_{refPh}$) is less than the phase comparison voltage ($V_{diff}$), the comparison result ($V_{ph}$) becomes "Low". Consequently, based on the comparison result ($V_{Ph}$), it is possible to determine a region between the two regions to which the phase ($\angle\Gamma_L$) of the reflection coefficient belongs.

Figure 5A:
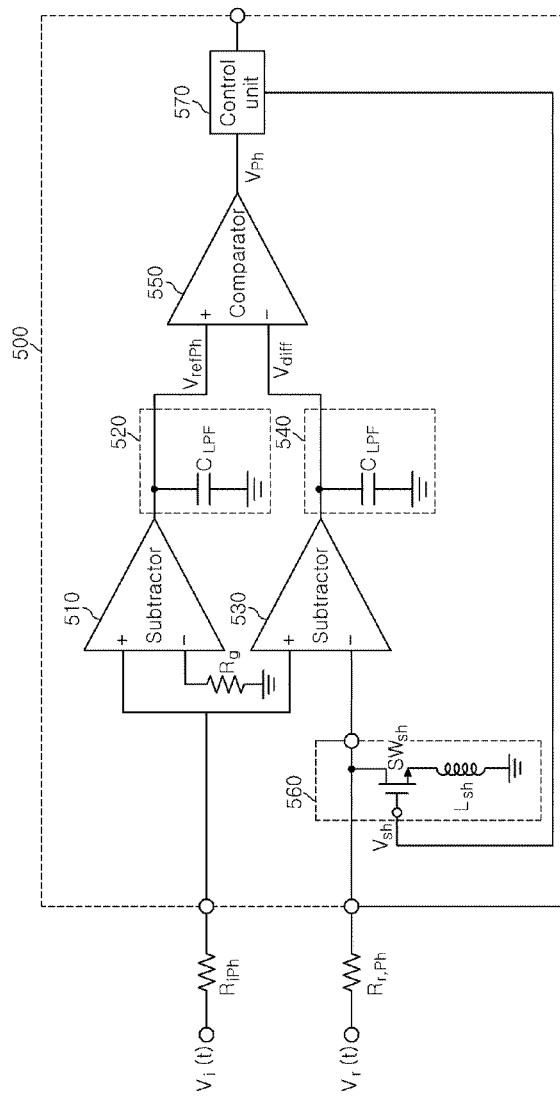
FIG. 5A shows a reflection coefficient phase detector in accordance with another embodiment.

FIG. 5A shows a reflection coefficient phase detector 500 in accordance with another embodiment Referring to FIG. 5A, the reflection coefficient phase detector 500 includes a first subtractor 510, a resistor ($R_g$), a first low pass filter 520, a second subtractor 530, a second low pass filter 540, a comparator 550, a phase shifter 560, and a control unit 570.

As configurations and operations of the first subtractor 510, the first low pass filter 520, the second subtractor 530, the second low pass filter 540, and the comparator 550 are the same as those of the reflection coefficient phase detector 400 illustrated in FIG. 4A, repeated descriptions will be omitted for brevity.

The phase shifter 560 includes a switch ($SW_{sh}$) and an inductor ($L_{sh}$), connected to each other in series. Based on a phase-shift control signal ($V_{sh}$), which is generated by the control unit 570, the phase shifter 560 may turn on or turn off the switch ($SW_{sh}$). When the switch ($SW_{sh}$) is turned on, the phase shifter 560 outputs a phase-shifted reflected signal by shifting the phase ($\angle\Gamma_L$) of the received reflected signal by 90°. When the switch ($SW_{sh}$) is turned off, the phase shifter 560 outputs the received reflected signal intact.

Figure 5B:
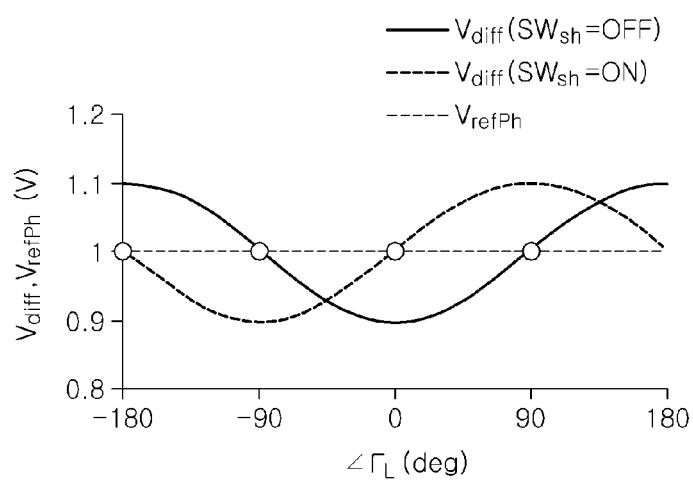
FIG. 5B is an exemplary graph showing phase reference voltages and phase comparison voltages of the reflection coefficient phase detector of FIG. 5A against phases of a reflection coefficient.
Figure 5C:
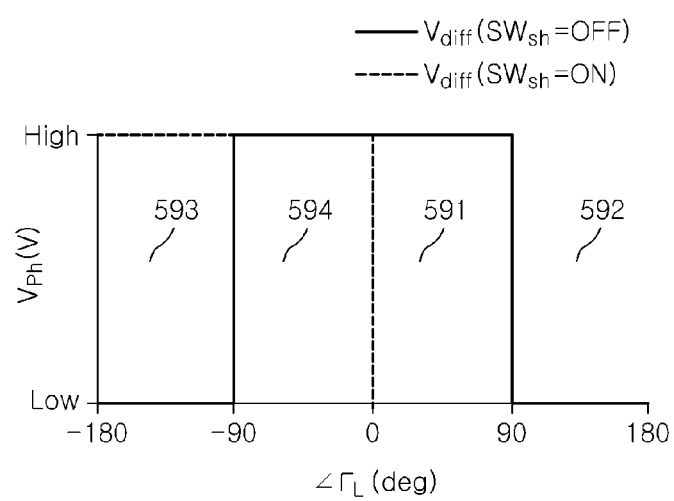
FIG. 5C is an exemplary graph showing comparison results of a comparator of the reflection coefficient phase detector of FIG. 5A against phases of a reflection coefficient.

FIG. 5B is an exemplary graph showing phase reference voltages ($V_{refPh}$) and phase comparison voltages ($V_{diff}$) of the reflection coefficient phase detector 500 of FIG. 5A against phases ($\angle\Gamma_L$) of a reflection coefficient. FIG. 5C is an exemplary graph showing comparison results ($V_{ph}$) of a comparator 550 of the reflection coefficient phase detector 500 of FIG. 5A against phases of a reflection coefficient Referring to FIGS. 5B and 5C, when the switch ($SW_{sh}$) is turned off, the same results as those of FIGS. 4B and 4C may be obtained. When the switch ($SW_{sh}$) is turned on, the phase reference voltage ($V_{refPh}$), the phase comparison voltage ($V_{diff}$), and the comparison result ($V_{Ph}$) are shifted by 90°, compared to when the switch ($SW_{sh}$) is turned off. Accordingly, in FIG. 5C, according to a combination of the comparison result ($V_{Ph}$) (hereinafter, a first comparison result) when the switch ($SW_{sh}$) is turned off, and the comparison result ($V_{Ph}$) (hereinafter, a second comparison result) when the switch ($SW_{sh}$) is turned on, the phase ($\angle\Gamma_L$) of the reflection coefficient may be distinguished into four regions 591 to 594.

Based on the first comparison result and the second comparison result, the control unit 570 may detect a region among the four regions 591 to 594 to which the phase ($\angle\Gamma_L$) of the reflection coefficient belongs. For example, when the first comparison result is "High" and the second comparison result is "Low", the control unit 570 determines that the phase ($\angle\Gamma_L$) of the reflection coefficient belong to the region 591. When the first and second comparison results are "Low" and "Low", "Low" and "High", and "High" and "High", the control unit 570 determines that the phase ($\angle\Gamma_L$) of the reflection coefficient is included in the region 592, the region 593, and the region 594, respectively. As described above, the reflection coefficient phase detector 500 in accordance with another embodiment detects the region where the phase ($\angle\Gamma_L$) of the reflection coefficient is included more precisely.

Figure 6A:
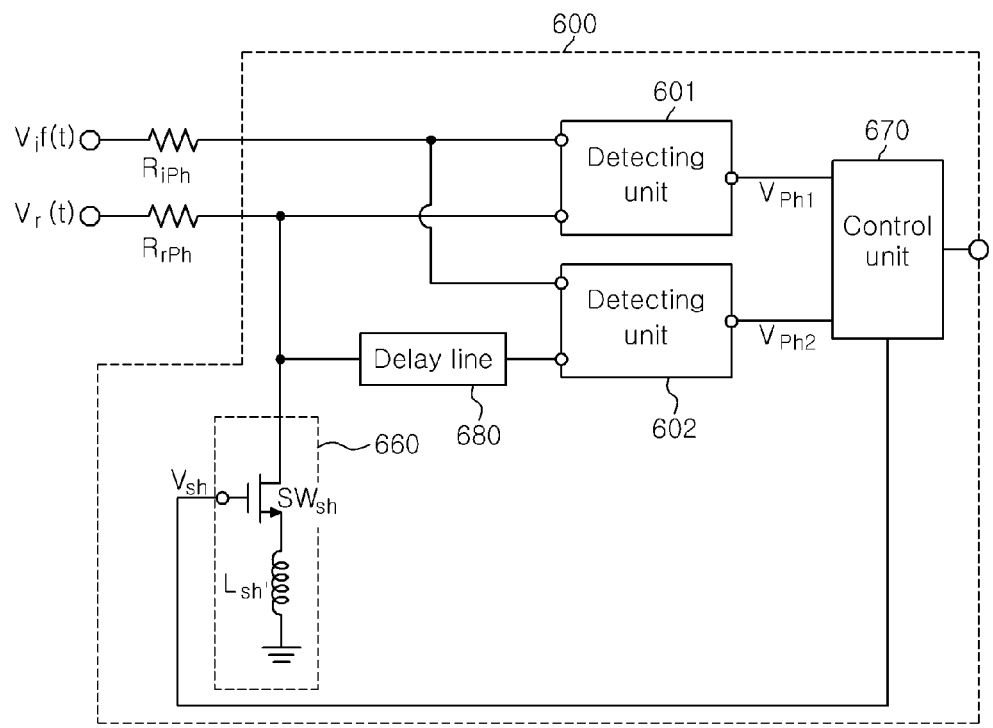
FIG. 6A shows a reflection coefficient phase detector in accordance with still another embodiment.

FIG. 6A shows a reflection coefficient phase detector 600 in accordance with still another embodiment Referring to FIG. 6A, the reflection coefficient phase detector 600 includes a first detecting unit 601, a second detecting unit 602, a phase shifter 660, a control unit 670, and a delay line 680.

The first detecting unit 601 may be the same as a circuit including the first subtractor 510, the resistor ($R_g$), the first low pass filter 520, the second subtractor 530, the second low pass filter 540 and the comparator 550, shown in FIG. 5A.

The second detecting unit 602 may be a circuit the same as the first detecting unit 601.

The phase shifter 660 includes a switch ($SW_{sh}$) and an inductor ($L_{sh}$) connected to each other in series. Based on a phase shift control signal ($V_{sh}$) generated by the control unit 670, the phase shifter 660 may turn on or turn off the switch ($SW_{sh}$). When the switch ($SW_{sh}$) is turned on, the phase shifter 660 may output a phase-shifted reflected signal by shifting the phase ($\angle\Gamma_L$) of a received reflected signal by 45°. When the switch ($SW_{sh}$) is turned off, the phase shifter 660 outputs the received reflected signal intact The delay line 680, connected between the second detecting unit 602 and the phase shifter 660, delays a phase of an output of the phase shifter 660 by 90°.

Figure 6B:
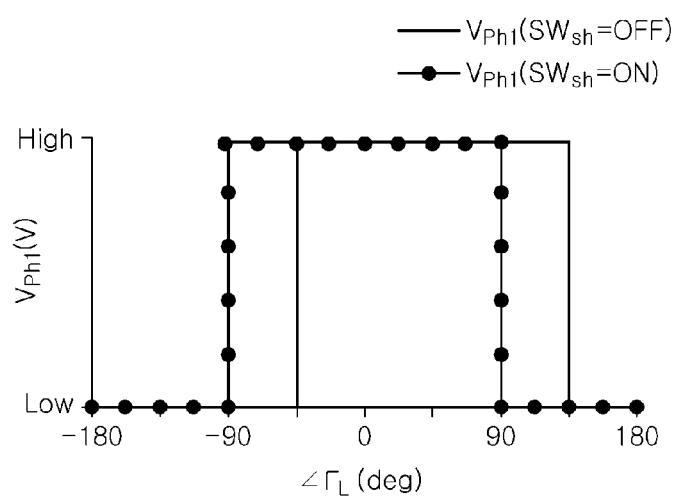
FIGS. 6B to 6D are exemplary graphs showing outputs of a first detection unit and a second detection unit of a reflection coefficient phase detector of FIG. 6A against phases of a reflection coefficient.
Figure 6C:
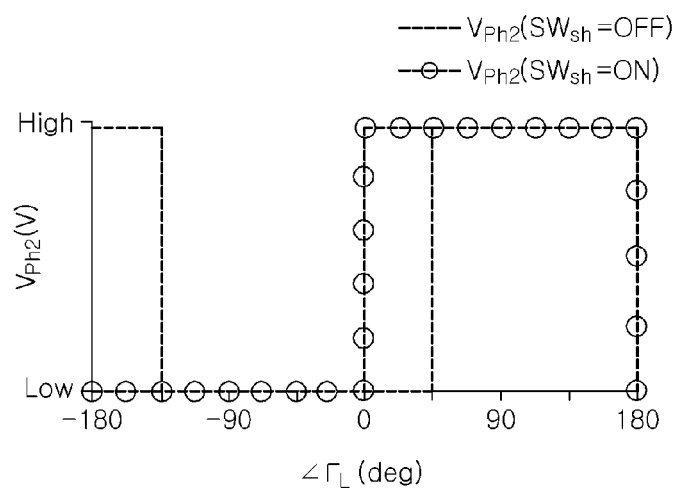
Figure 6D:
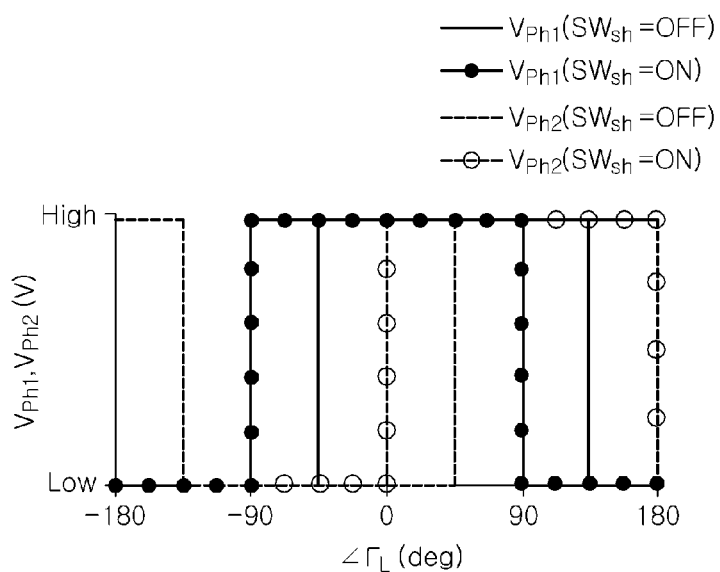

Accordingly, comparison results ($V_{Ph1}$, $V_{Ph2}$) of the first detecting unit 601 and the second detecting unit 602 may be obtained as shown in FIGS. 6B to 6D.

FIG. 6B is a graph showing outputs ($V_{Ph1}$) of the first detecting unit 601 when the switch ($SW_{sh}$) is turned on, and when the switch ($SW_{sh}$) is turned off, respectively. FIG. 6C is a graph showing outputs ($V_{Ph2}$) of the second detecting unit 602 when the switch ($SW_{sh}$) is turned on, and when the switch ($SW_{sh}$) is turned off, respectively. Referring to FIGS. 6B and 6C, by the delay line 680, the outputs ($V_{Ph2}$) of the second detecting unit 602 are delayed by 90° compared to the outputs ($V_{Ph1}$) of the first detecting unit 601.

FIG. 6D is a graph showing the outputs ($V_{Ph1}$) of the first detecting unit 601 and the outputs ($V_{Ph2}$) of the second detecting unit 602 together. Referring to FIG. 6D, depending on whether each of the outputs ($V_{Ph1}$, $V_{Ph2}$) of the first detecting unit 601 and the second detecting unit 602 when the switch ($SW_{sh}$) is turned off is "High" or "Low", and depending on whether each of the outputs ($V_{Ph1}$, $V_{Ph2}$) of the first detecting unit 601 and the second detecting unit 602 when the switch ($SW_{sh}$) is turned on is "High" or "Low", the phase ($\angle\Gamma_L$) of the reflection coefficient may be divided into eight regions.

Accordingly, based on whether the switch ($SW_{sh}$) is turned on or turned off, whether the output ($V_{Ph1}$) of the first detecting unit 601 is "High" or "Low", and whether the output ($V_{Ph2}$) of the second detecting unit 602 is "High" or "Low", the control unit 670 determines a region among the eight regions to which the phase ($\angle\Gamma_L$) of the reflection coefficient belongs. Consequently, the reflection coefficient phase detector 600 in accordance with still another embodiment detects the region where a phase ($\angle\Gamma_L$) of a reflection coefficient is included more precisely.

Figure 7:
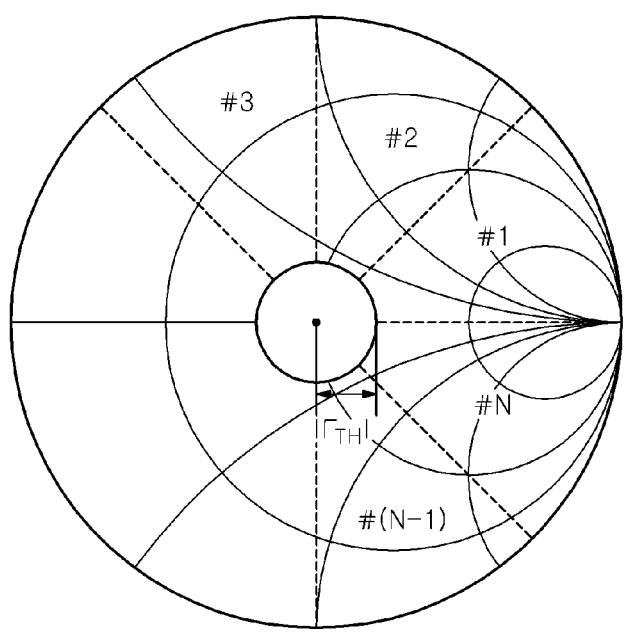
FIG. 7 illustrates phase regions distinguished by reflection coefficient phase detectors in accordance with further another embodiment.

FIG. 7 illustrates phase regions distinguished by reflection coefficient phase detectors in accordance with further another embodiment.

By adding at least one of a phase shifter, and a delay line and a detecting unit connected to the delay line, a phase region to be detected may be subdivided to N regions as illustrated in FIG. 7.

Figure 8:
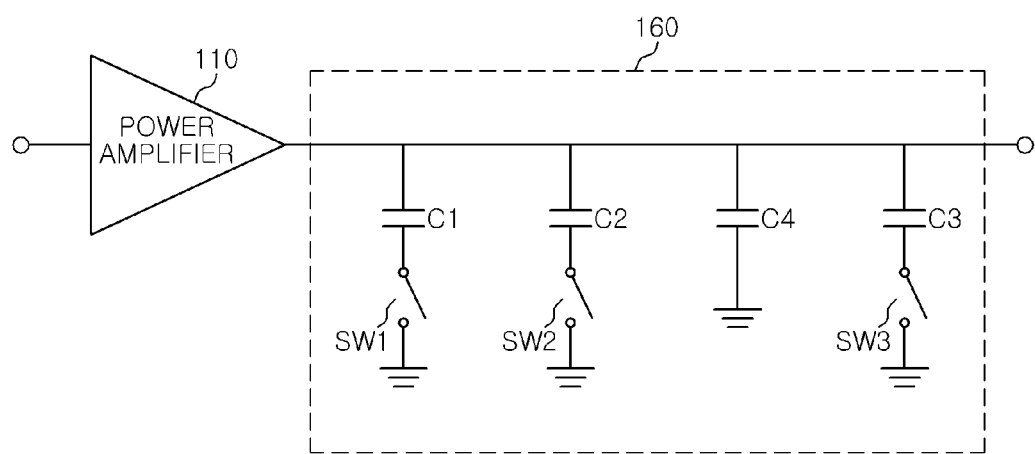
FIG. 8 illustrates an output matching network in accordance with a representative embodiment.

FIG. 8 illustrates in more detail an output matching network 160 of FIG. 1.

Referring to FIG. 8, the output matching network 160 includes three switched capacitors C1, C2, and C3, three switches SW1, SW2, and SW3, and a shunt capacitor C4. According to combinations of ON/OFF of the switches SW1, SW2, and SW3, the output matching network 160 may variably adjust load impedance ($Z_L$) of a power amplifier 110. The output matching network 160 may be controlled by the mismatch detector 150.

Figure 9:
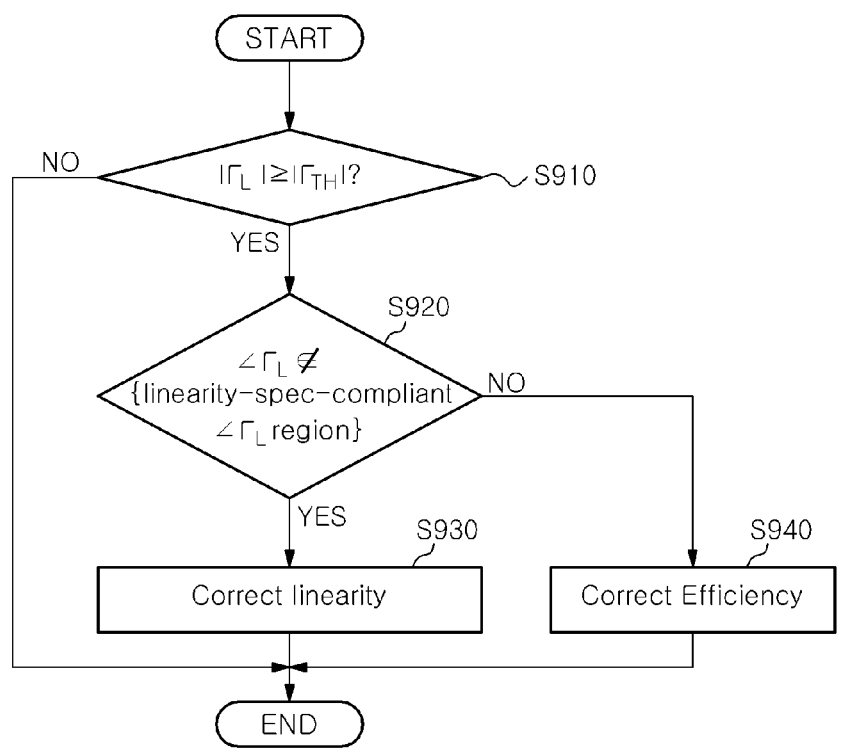
FIG. 9 is a flow chart illustrating an operation method for impedance matching of an amplifier module in accordance with a representative embodiment.

FIG. 9 is a flow chart illustrating an operation method for impedance matching of an amplifier module in accordance with a representative embodiment Referring to FIG. 9, a mismatch detector 150 determines whether the magnitude ($|\Gamma_L|$) of a reflection coefficient is equal to or greater than the threshold ($|\Gamma_{TH}|$) at step S910. When the magnitude ($|\Gamma_L|$) of the reflection coefficient is less than the threshold ($|\Gamma_{TH}|$), as impedance adjustment is not necessary, an operation for impedance matching is terminated When the magnitude ($|\Gamma_L|$) of the reflection coefficient is equal to or greater than the threshold ($|\Gamma_{TH}|$), mismatch detector 150 determines whether the phase ($\angle\Gamma_L$) of the reflection coefficient is not included in a region that is compliant with a linearity specification at step S920. When the phase ($\angle\Gamma_L$) of the reflection coefficient is not included in a region that is compliant with the linearity specification, the load impedance ($Z_L$) of the power amplifier 110 is adjusted by the output matching network 160 at step S930. Even if the phase ($\angle\Gamma_L$) of the reflection coefficient is included in the region that is compliant with the linearity specification, as necessary, the load impedance ($\angle\Gamma_L$) may be adjusted to improve efficiency of the amplifier module 100 at step S940.

As described above, amplifier modules in accordance with embodiments described above may compare a magnitude of a reflection coefficient with a threshold that is controlled depending on a control signal, and may detect a region among multiple regions to which a phase of the reflection coefficient belongs, whereby it is possible to accurately correct a impedance mismatch between a power amplifier and an antenna.

In view of this disclosure it is noted that various amplifier modules can be implemented in a variety of elements and variant structures. Further, the various elements, structures and parameters are included by way of example only and not in any limiting sense. In view of this disclosure, those skilled in the art can implement the present teachings in determining their own applications and needed elements and equipment to implement these applications, while remaining within the scope of the appended claims.

What is claimed is:

1. A phase detector for use in an RF device for detecting a phase of a reflection coefficient, comprising:
a first subtractor configured to output a phase reference voltage, the first subtractor comprising a non-inverting terminal configured to receive an incident signal and an inverting terminal connected to a ground node;
a control unit configured to generate a phase-shift control signal;
a phase shifter configured to output a reflected signal based on the phase-shift control signal, or to output a phase-shifted reflected signal by shifting a phase of the reflected signal based on the phase-shift control signal;
a second subtractor configured to output a phase comparison voltage by using a difference between the incident signal and an output of the phase shifter; and
a comparator configured to output a comparison result by comparing the phase reference voltage with the phase comparison voltage, the control unit being configured to: obtain a first comparison result of the comparator when the phase shifter outputs the reflected signal; obtain a second comparison result of the comparator when the phase shifter outputs the phase-shifted reflected signal; and detect a phase range to which the phase of the reflection coefficient belongs based on the first comparison result and the second comparison result.

2. The phase detector of claim 1, wherein the second subtractor comprises:
a non-inverting terminal configured to receive the incident signal; and
an inverting terminal configured to receive the output of the phase shifter.

3. The phase detector of claim 1, wherein the comparator is configured to output a first result value when the phase reference voltage is equal to or greater than the phase comparison voltage, and to output a second result value when the phase reference voltage is smaller than the phase comparison voltage.

4. The phase detector of claim 3, wherein the control unit is configured to:

determine that the phase of the reflection coefficient belongs to a first region when the first comparison result is the first result value and the second comparison result is the first result value;

to determine that the phase of the reflection coefficient is included in a second region when the first comparison result is the first result value and the second comparison result is the second result value;

to determine that the phase of the reflection coefficient is included in a third region when the first comparison result is the second result value and the second comparison result is the first result value; and to determine that the phase of the reflection coefficient is included in a fourth region when the first comparison result is the second result value and the second comparison result is the second result value.

5. The phase detector of claim 1, further comprising:
a third subtractor configured to output an additional phase reference voltage, the third subtractor comprising a non-inverting terminal configured to receive the incident signal and an inverting terminal connected to a ground node;
a delay line configured to delay a phase of the output of the phase shifter;
a fourth subtractor configured to output an additional phase comparison voltage by using a difference between the incident signal and an output of the delay line; and
an additional comparator configured to output a comparison result by comparing the additional phase reference voltage with the additional phase comparison voltage,
wherein the control unit is configured to: obtain a third comparison result of the additional comparator when the phase shifter outputs the reflected signal; obtain a fourth comparison result of the additional comparator when the phase shifter outputs the phase-shifted reflected signal; and detect a phase range to which the phase of the reflection coefficient belongs based on the first comparison result, the second comparison result, the third comparison result, and the fourth comparison result.

6. An amplifier module for use in an RF device comprising the phase detector of claim 1.

7. The amplifier module of claim 6, wherein the second subtractor comprises:
a non-inverting terminal configured to receive the incident signal; and
an inverting terminal configured to receive the output of the phase shifter.

8. The amplifier module of claim 6, wherein the comparator is configured to output a first result value when the phase reference voltage is equal to or greater than the phase comparison voltage, and to output a second result value when the phase reference voltage is smaller than the phase comparison voltage.

9. The amplifier module of claim 8, wherein the control unit is configured to determine that the phase of the reflection coefficient belongs to a first region when the first comparison result is the first result value and the second comparison result is the first result value, to determine that the phase of the reflection coefficient is included in a second region when the first comparison result is the first result value and the second comparison result is the second result value, to determine that the phase of the reflection coefficient is included in a third region when the first comparison result is the second result value and the second comparison result is the first result value, and to determine that the phase of the reflection coefficient is included in a fourth region when the first comparison result is the second result value and the second comparison result is the second result value.

10. The phase detector of claim 1, wherein the non-inverting terminal of the first subtractor receives the incident signal through a resistor.

11. The phase detector of claim 10, wherein the non-inverting terminal is a first non-inverting terminal, the resistor is a first resistor, and the second subtractor comprises a second non-inverting terminal for receiving the incident signal through a second resistor.

12. The phase detector of claim 1, wherein the inverting terminal of the first subtractor is connected to a ground node through a resistor.

13. The phase detector of claim 12, wherein the inverting terminal is a first inverting terminal, the resistor is a first resistor, and the second subtractor comprises a second inverting terminal for receiving the incident signal through a second resistor.

14. The phase detector of claim 1, wherein the phase reference voltage has a constant value irrespective of a phase of a reflection coefficient.

15. The phase detector of claim 1, wherein the phase comparison voltage varies as a phase of the reflection coefficient varies.

16. The phase detector of claim 1, further comprising a low pass filter that is connected to an output terminal of the first subtractor and outputs the phase reference voltage.

17. The phase detector of claim 1, further comprising a low pass filter that is connected to an output terminal of the second subtractor and outputs the phase comparison voltage.

* * * * *